(12) United States Patent
Zhao

(10) Patent No.: US 10,446,402 B2
(45) Date of Patent: Oct. 15, 2019

(54) SEMICONDUCTOR DEVICE

(71) Applicant: Semiconductor Manufacturing International (Shanghai) Corporation, Shanghai (CN)

(72) Inventor: Jie Zhao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/697,905

(22) Filed: Sep. 7, 2017

(65) Prior Publication Data

US 2017/0365479 A1    Dec. 21, 2017

Related U.S. Application Data

(62) Division of application No. 14/992,448, filed on Jan. 11, 2016, now Pat. No. 9,786,508.

(30) Foreign Application Priority Data

Jan. 9, 2015    (CN) .......................... 2015 1 0012074

(51) Int. Cl.
*H01L 21/28* (2006.01)
*H01L 21/8234* (2006.01)
*H01L 27/088* (2006.01)
*H01L 29/51* (2006.01)

(52) U.S. Cl.
CPC .. *H01L 21/28229* (2013.01); *H01L 21/28088* (2013.01); *H01L 21/82345* (2013.01); *H01L 27/088* (2013.01); *H01L 29/513* (2013.01)

(58) Field of Classification Search
CPC ....... H01L 21/28229; H01L 21/823458; H01L 29/513; H01L 27/088
See application file for complete search history.

(56) References Cited

U.S. PATENT DOCUMENTS

| 6,054,353 | A | 4/2000 | Shen et al. |
| 6,849,492 | B2 | 2/2005 | Helm et al. |
| 7,148,548 | B2 | 12/2006 | Doczy et al. |
| 2002/0084483 | A1 | 7/2002 | Rudeck |
| 2004/0005749 | A1 | 1/2004 | Choi et al. |
| 2007/0278558 | A1* | 12/2007 | Koyama ........... H01L 21/26513 257/315 |
| 2008/0197424 | A1* | 8/2008 | Haensch ........... H01L 21/26586 257/407 |
| 2012/0122309 | A1* | 5/2012 | Park ................. H01L 21/28185 438/591 |

(Continued)

FOREIGN PATENT DOCUMENTS

CN    103311247 A    9/2013

*Primary Examiner* — Kenneth Parker
*Assistant Examiner* — Long H Le
(74) *Attorney, Agent, or Firm* — Anova Law Group, PLLC

(57) ABSTRACT

The present disclosure provides semiconductor devices and fabrication methods thereof. A work function layer is formed on the semiconductor substrate. A buffer layer is formed on the work function layer. The work function layer is doped through the buffer layer with impurity ions. The buffer layer obstructs a flow of the impurity ions to control a concentration of the impurity ions in different regions of the work function layer to regulate a work function of the work function layer in the different regions.

15 Claims, 6 Drawing Sheets

(56) References Cited

U.S. PATENT DOCUMENTS

| | | | |
|---|---|---|---|
| 2012/0244669 A1* | 9/2012 | Liao | H01L 21/823807 438/212 |
| 2012/0313178 A1 | 12/2012 | Liao et al. | |
| 2012/0329261 A1* | 12/2012 | Wang | H01L 21/265 438/589 |
| 2013/0102142 A1* | 4/2013 | Lee | H01L 21/823807 438/591 |
| 2015/0263004 A1* | 9/2015 | Cheon | H01L 29/4966 257/392 |
| 2016/0104786 A1* | 4/2016 | Yang | H01L 29/4966 257/369 |
| 2016/0126139 A1 | 5/2016 | Yang et al. | |

* cited by examiner

SEMICONDUCTOR DEVICE

CROSS REFERENCE TO RELATED APPLICATIONS

This application is a divisional of U.S. patent application Ser. No. 14/992,448, filed on Jan. 11, 2016, which claims the priority of Chinese patent application No. CN201510012074.1, filed on Jan. 9, 2015, the entire content of all of which is incorporated herein by reference.

FIELD OF THE DISCLOSURE

The present disclosure relates to the field of semiconductor technologies and, more particularly, relates to a semiconductor device and formation method thereof.

BACKGROUND

With the rapid development of integrated circuits (IC) manufacturing technology, the IC integration density continues to increase and the IC feature sizes continue to shrink. As IC devices are getting denser and smaller, metal oxide semiconductor (MOS) transistors become more widely used in IC devices. MOS transistor performance may affect IC performance. Among many parameters of MOS transistors, the threshold voltage (Vt) is the most important one.

Further, in order to improve the overall IC performance and the flexibility to handle mixed signals, most ICs include many individual semiconductor devices with various threshold voltages to enable the multi-threshold voltage capability of ICs.

In the conventional fabrication process of forming multiple semiconductor devices with various threshold voltages, the gate oxide layer, the channel region, the well region, and the source/drain regions may be doped with various types, energies, and dosages of impurity ions. In addition, work function layers with various thicknesses may be formed to adjust the threshold voltages of semiconductor devices.

However, with the reduction in size of semiconductor devices, the requirements for the accuracy of the ion implantation energy level and dosage become more stringent and difficult to satisfy. The ion implantation method for adjusting the work function of semiconductor devices may reduce the gate electron mobility and may worsen the performance of the semiconductor devices.

Work function layers with various thicknesses may be formed to adjust the threshold voltages of corresponding semiconductor devices. Referring to FIG. 1, a semiconductor substrate 10 has three active regions, a low threshold region I, a standard threshold region II and a high threshold region III. A dielectric layer 20 is formed on the semiconductor substrate 10. A first work function layer 21 is only formed on the dielectric layer 20. A first mask 22 is formed on the low threshold region I to protect the first work function layer 21 on the low threshold region I.

Referring to FIG. 2, after the first mask 22 is removed, a second work function layer 23 is formed on the first work function layer and on the standard threshold region II and the high threshold region III of the semiconductor substrate 10. A second mask is formed on the low threshold region I and the standard threshold region II to protect the second work function layer 23 on the low threshold region I and the standard threshold region II. The remaining second work function layer 23 is removed.

Referring to FIG. 3, a third work function layer 25 is formed on all three regions. In conclusion, the formed semiconductor device has a successively decreased thickness from the low threshold region I to the standard threshold region II to the high threshold region III. The thicker work function layers correspond to lower threshold voltage. The formed semiconductor device has a successively increased threshold voltage from the low threshold region I to the standard threshold region II to the high threshold region III. The above process is complicated due to the requirements for multiple masks, multiple work function layers and multiple removal processes.

The disclosed devices and methods are directed to solve one or more problems set forth above and other problems in the art.

BRIEF SUMMARY OF THE DISCLOSURE

One aspect of the present disclosure provides a method of forming a semiconductor device. A work function layer is formed on a semiconductor substrate. A buffer layer is formed on the work function layer. The work function layer is doped through the buffer layer with impurity ions, wherein the buffer layer obstructs a flow of the impurity ions to control a concentration of the impurity ions in different regions of the work function layer to regulate a work function of the work function layer in the different regions.

Another aspect of the present disclosure provides a semiconductor device. The semiconductor device includes a semiconductor substrate including: a first region including a first gate electrode trench therein for forming a first transistor, and a second region including a second gate electrode trench therein for forming a second transistor. A work function layer covers sidewalls and bottom of each of the first and second gate electrode trenches on the semiconductor substrate. A buffer layer is on the work function layer and configured to obstruct a flow of the impurity ions to control a concentration of the impurity ions in different regions of the work function layer to regulate work function of the work function layer in the different regions by a process. The process includes performing a first ion doping to dope the work function layer on the second region with first ions to increase the work function of the work function layer on the second region; removing the first mask and forming the buffer layer on the work function layer in the first and the second gate electrode trenches; and performing a second ion doping to dope the work function layer in the first and the second gate electrode trenches with second ions to increase the work function of the work function layer on the first and the second regions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
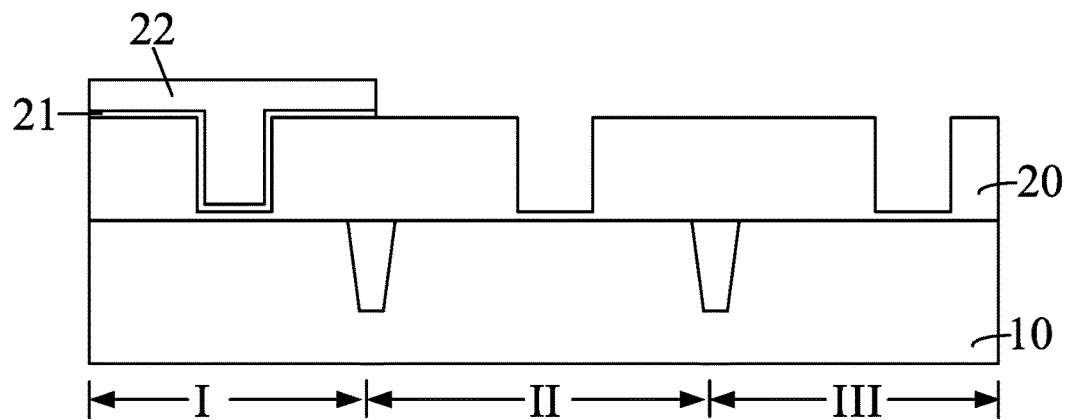
FIGS. 1-3 illustrate cross sectional structures of a semiconductor structure corresponding to certain stages of a conventional fabrication process.
Figure 2:
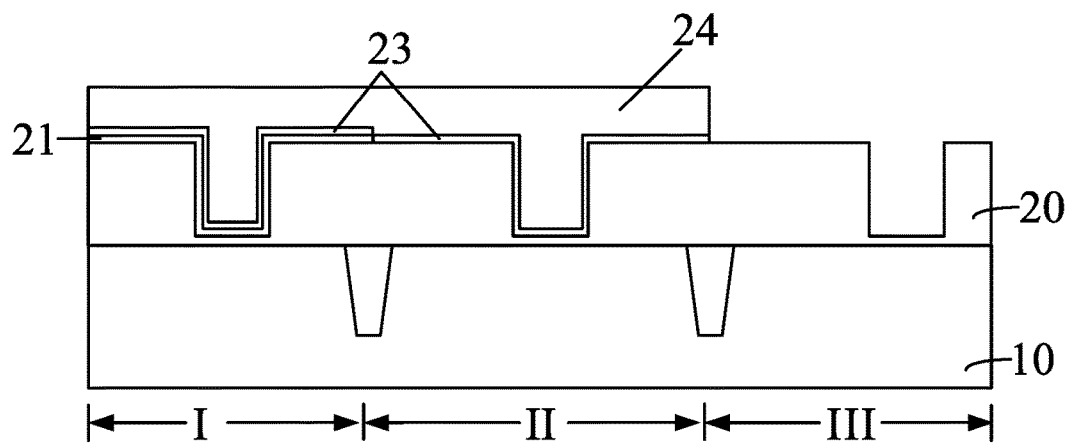
Figure 3:
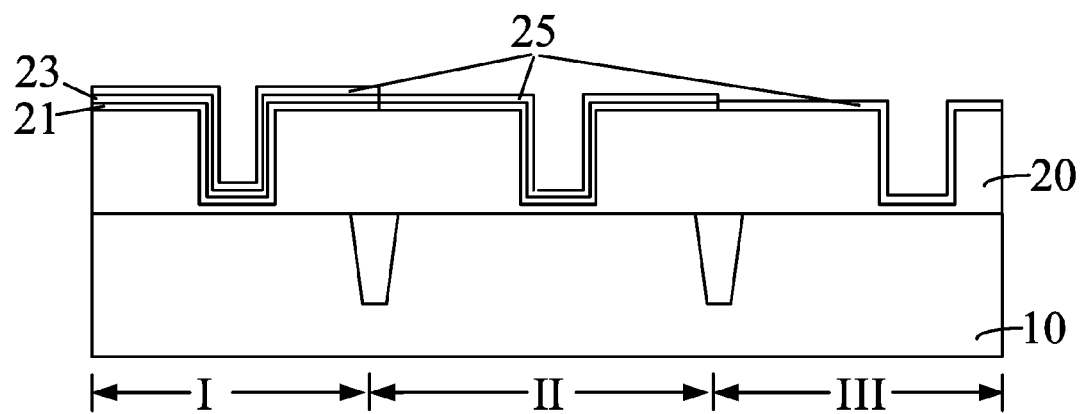

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Conventional fabrication methods for forming semiconductor devices with various threshold voltages may adjust threshold voltages of individual semiconductor devices by regulating the amount of ions to be injected into the semiconductor devices or by controlling thicknesses of work function layers in individual semiconductor devices.

However, with the reduction in size of semiconductor devices, the requirements for the accuracy of the ion implantation energy level and dosage become more stringent and difficult to satisfy. The process of controlling the thicknesses of the work function layers in the semiconductor devices has many complicated steps and difficult to implement.

The present disclosure provides a simplified method of forming semiconductor devices with various threshold voltages.

To form a semiconductor device, a semiconductor substrate may be provided. A work function layer may be formed on the semiconductor substrate. A buffer layer may be formed on the work function layer. Dopant ions may be injected into the work function layer covered by the buffer layer. In the ion implantation process, the buffer layer may be used to obstruct the flow of implanted ions to regulate the work function of the work function layer. Thus, the work function of the subsequently formed semiconductor device may be adjusted.

In the present disclosure, under certain conditions without changing the ion implantation process and the thickness of the work function layer, a buffer layer may be formed on the work function layer. By adjusting the thickness and the material of the buffer layer, the amount of ions penetrating through the buffer layer may be controlled and the amount of ions entering into the work function layer may also be controlled. Thus, the work function of the work function layer may be regulated. Compared to the conventional method of adjusting the work function of the work function layer by controlling the work function layer thickness or the ion implantation process parameters, the present disclosure is simplified and effective in adjusting the work function of the work function layer and streamlines the process of forming semiconductor devices with various threshold voltages.

The above objectives, features and advantages of the present disclosure can be more fully understood with reference to the following specific embodiments of the disclosure described in detail below.

FIGS. 4-10 illustrate cross sectional structures of an exemplary semiconductor structure corresponding to certain stages of a fabrication process consistent with various disclosed embodiments. FIG. 11 illustrates a flow chart of an exemplary method for fabricating a semiconductor structure consistent with various disclosed embodiments.

It should be noted that for ease of showing the semiconductor device structure in each step of the exemplary embodiments, the graphical structure and the ratio of the dimensional sizes of the drawings may be slightly different, but the difference in the respective drawings does not affect the scope of protection of the present disclosure.

Figure 4:
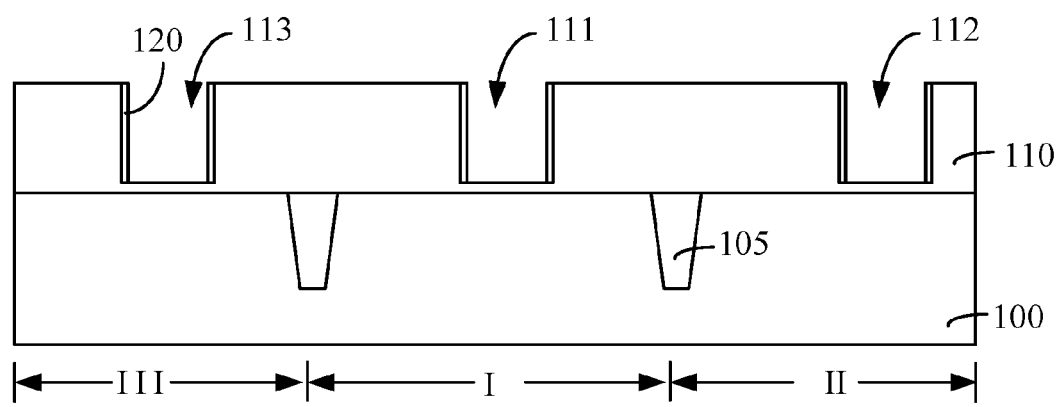
FIGS. 4-10 illustrate cross sectional structures of an exemplary semiconductor structure corresponding to certain stages of a fabrication process consistent with various disclosed embodiments.

As shown in FIG. 11, at the beginning of the fabrication process, a semiconductor substrate having three active regions is provided and a dielectric layer is formed on the semiconductor substrate (S01). FIG. 4 illustrates a cross-sectional view of a corresponding structure of the exemplary semiconductor device consistent with the disclosed embodiments.

As shown in FIG. 4, a semiconductor substrate 100 is provided. The semiconductor substrate 100 may be made of silicon, polycrystalline silicon, amorphous silicon or silicon-on-insulator. In other embodiments, the semiconductor substrate 100 may be made of germanium, silicon germanium or other suitable material. In one embodiment, the semiconductor substrate 100 is made of silicon. The present disclosure does not limit the material or the structure of the semiconductor substrate 100.

In one embodiment, the semiconductor substrate 100 may include a first region I, a second region II and a third region III. The third region III may be used to form a device with a low threshold voltage. The first region I may be used to form a device with a standard threshold voltage. The second region II may be used to form a device with a high threshold voltage.

Optionally, shallow trench isolation (STI) structures 105 may be formed in the semiconductor substrate 100 to isolate the first region I, the second region II and the third region III from being electrically connected with one another.

Referring to FIG. 4, a dielectric layer 110 is formed on the semiconductor substrate 100. Later a work function layer may be formed on the dielectric layer 110.

In one embodiment, a first gate electrode trench 111, a second gate electrode trench 112 and a third gate electrode trench 113 may be formed in the dielectric layer 110 in the first region I, the second region II and the third region III respectively. Later, the third gate electrode trench 113 may be used to form a third transistor with a low threshold voltage. The first gate electrode trench 111 may be used to form a first transistor with a standard threshold voltage. And the second gate electrode trench 112 may be used to form a second transistor with a high threshold voltage.

Optionally, the first transistor, the second transistor and the third transistor may be NMOS transistors.

In one embodiment, a spacer layer 120 may be formed on the sidewalls of each of the first gate electrode trench 111, the second gate electrode trench 112 and the third gate electrode trench 113. Known fabrication processes for forming the trenches and the spacer layer may be included in the present disclosure.

Figure 5:
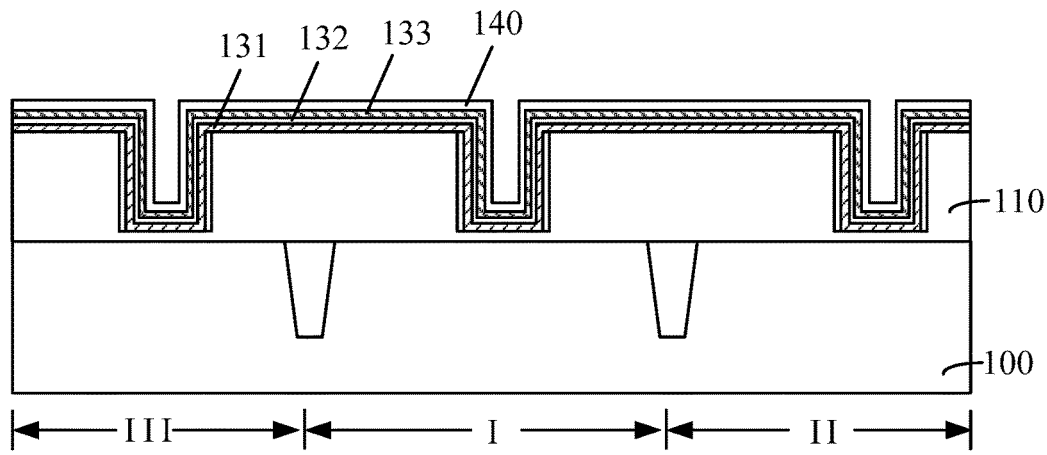

Returning to FIG. 11, a high K dielectric layer, a gate dielectric layer and a diffusion barrier layer are formed successively on the dielectric layer and then a work function layer is formed (S02). FIG. 5 illustrates a cross-sectional view of a corresponding structure of the exemplary semiconductor device consistent with the disclosed embodiments.

As shown in FIG. 5, after the dielectric layer 110 is formed on the semiconductor substrate 100 and before a work function layer is formed, a high K dielectric layer 131, a gate dielectric layer 132 and a diffusion barrier layer 133 may be formed successively on the dielectric layer 110 and in each of the first gate electrode trench 111, the second gate electrode trench 112 and the third gate electrode trench 113.

The high K dielectric layer 131, the gate dielectric layer 132 and the diffusion barrier layer 133 may successively cover the sidewalls and the bottoms of the first gate electrode trench 111, the second gate electrode trench 112 and the third gate electrode trench 113 in the dielectric layer 110 and the surface of the dielectric layer 110 as well.

The high K dielectric layer 131 may be made of LaO, AlO, BaZrO, HfZrO, HfZrON, HfLaO, HfSiO, HfSiON, LaSiO, AlSiO, HfTaO, HfTiO, (Ba, Sr)TiO$_3$, Al$_2$O$_3$, and/or Si$_3$N$_4$. The fabrication process may include physical vapor deposition (PVD), chemical vapor deposition (CVD), or atomic layer deposition (ALD).

Optionally, the high K dielectric layer 131 may have a thickness ranging approximately from 10 Å to 30 Å.

The gate dielectric layer 132 may be made of La$_2$O$_3$, Al$_2$O$_3$, Ga$_2$O$_3$, In$_2$O$_3$, MoO, Pt, Ru, TaCNO, Ir, TaC, MoN, WN and/or Ti$_x$N$_{1-x}$ (x≤1). The fabrication process may include physical vapor deposition (PVD), chemical vapor deposition (CVD), or atomic layer deposition (ALD).

Optionally, the gate dielectric layer 132 may have a thickness ranging approximately from 5 Å to 20 Å.

The diffusion barrier layer 133 may be made of TaN, Ta, and/or TaAl. The fabrication process may include physical vapor deposition (PVD), chemical vapor deposition (CVD) or atomic layer deposition (ALD).

Optionally, the diffusion barrier layer 133 may have a thickness ranging approximately from 5 Å to 20 Å.

In one embodiment, the high K dielectric layer 131 and the gate dielectric layer 132 may provide an effective electrical isolation between the gate electrode material filling the gate electrode trenches and the semiconductor substrate 100. The diffusion barrier layer 133 may provide an effective barrier preventing the gate electrode material filling the gate electrode trenches from diffusing into the dielectric layer 110. Thus, the performance of the subsequently formed gate electrodes may be improved.

The present disclosure does not limit the material, the fabrication process, the thickness or the structure of the high K dielectric layer 131, the gate dielectric layer 132 and the diffusion barrier layer 133. Further, in other embodiments, the high K dielectric layer 131, the gate dielectric layer 132 and the diffusion barrier layer 133 may be optional and may not be formed. Alternatively, one or more of the high K dielectric layer 131, the gate dielectric layer 132 and the diffusion barrier layer 133 may be selected and formed. The presence of the high K dielectric layer 131, the gate dielectric layer 132 and the diffusion barrier layer 133 does not affect achieving the objectives of the present disclosure.

Referring to FIG. 5, a work function layer 140 may be formed on the diffusion layer 133. The work function layer 140 may cover the sidewalls and the bottoms of the first gate electrode trench 111, the second gate electrode trench 112 and the third gate electrode trench 113. The work function layer 140 may be used to adjust the threshold voltages of the subsequently formed semiconductor devices in each region.

In one embodiment, the subsequently formed transistors may be NMOS transistors. The work function layer 140 may be made of tantalum carbide (TaC), titanium (Ti), aluminum (Al) and/or titanium aluminum compound (Ti$_x$Al$_{1-x}$) (x≤1).

Optionally, in one embodiment, the work function layer 140 may have a thickness ranging approximately from 10 Å to 80 Å.

Figure 6:
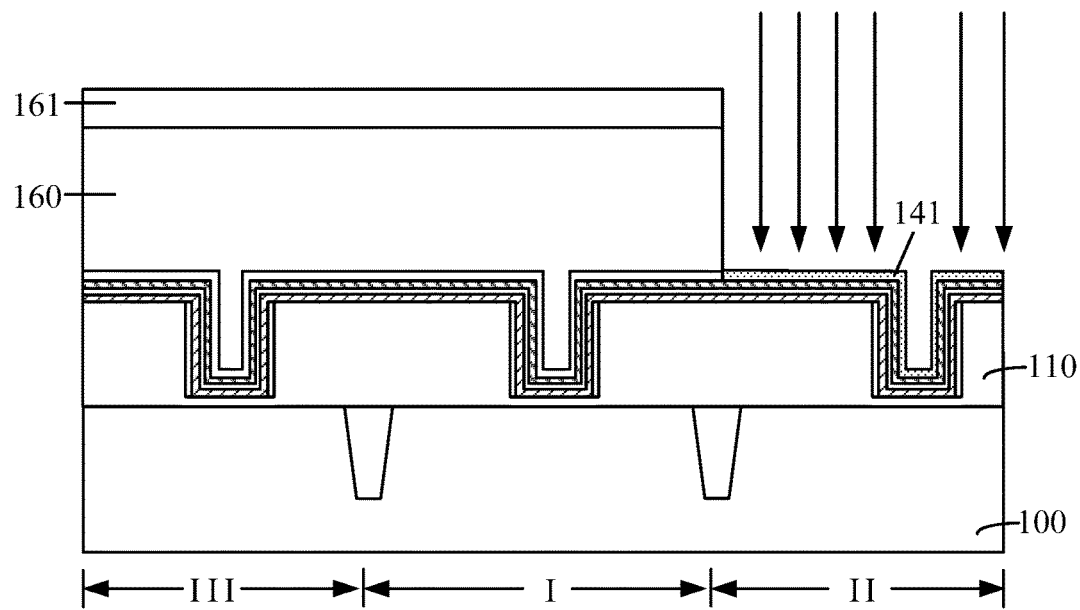

Returning to FIG. 11, a first mask is formed on the first region and the third region and is used to dope first ions into the work function layer on the second region to increase the work function of the work function layer on the second region and to form a work function layer doped with first ions (S03). FIG. 6 illustrates a cross-sectional view of a corresponding structure of the exemplary semiconductor device consistent with the disclosed embodiments.

As shown in FIG. 6, a first mask 160 may be formed on the first region I and the third region III and may be used to dope first ions into the work function layer 140 on the second region II to increase the work function of the work function layer 140 on the second region II and to form a work function layer 141 doped with first ions.

In one embodiment, the first mask 160 may be made of deep ultraviolet light absorbing oxide (DUO).

In other embodiments, the first mask may be made of amorphous polysilicon or amorphous carbon. DUO, amorphous polysilicon and amorphous carbon may be removed readily and may leave few residuals in the first gate electrode trench 111, the second gate electrode trench 112 and the third gate electrode trench 113. Thus, the performance of the subsequently formed semiconductor devices may be improved.

To form the first mask 160, a first mask material layer may be formed on the semiconductor substrate 100. A photoresist layer may be formed on the first mask material layer. Then the photoresist layer may be exposed and developed to form a photoresist mask 161 on the first mask material layer. The photoresist mask 161 may be used as an etch mask to etch the first mask material layer to form the first mask 160.

Optionally, the first mask material layer may have a thickness greater than the depth of the first gate electrode trench 111, the second gate electrode trench 112 and the third gate electrode trench 113 to avoid excessive etching of the first mask material layer on the first region I and the third region III during the process of etching the first mask material layer in the second gate electrode trench 112 and after the removal of the photoresist mask 161. The remaining first mask material layer may still be able to prevent first ions from entering into the work function layer on the first region I and the third region III.

In one embodiment, the first ions may include one or more of boron (B) ions, silicon ions (Si) and fluorine (F) ions to increase the work function of the work function layer 141 doped with first ions.

Optionally, the first ion doping process may be a plasma ion implantation process.

The plasma ion implantation process may have a plasma implantation energy ranging approximately from 0.5 KeV to 2.0 KeV and a dosage ranging approximately from $1.0 \times 10^{14}$ atom/cm$^2$ to $1.0 \times 10^{19}$ atom/cm$^2$.

The steps of implanting the first ions may include pumping a plasma generation gas into the reaction chamber to generate a plasma and then injecting the plasma into the work function layer exposed by the first mask 160.

The reaction gas may include one or more of silicon source gas, fluorine source gas and boron source gas.

Optionally, the silicon source gas may be SiH$_4$ and the boron source gas may be BH$_2$.

The plasma ion implantation process may have a controlled reaction gas flow rate ranging approximately from 30 sccm to 1000 sccm, a controlled temperature ranging approximately from 25° C. to 500° C., a power ranging approximately from 50 W to 1000 W, and an air pressure ranging approximately from 2 mtorr to 5 mtorr.

In the plasma ion implantation process, the plasma gas flow rate, the power, the air pressure, the ion implantation energy and dosage may be determined by the target work function level. The present disclosure does not limit the conditions of the plasma ion implantation process.

Figure 7:
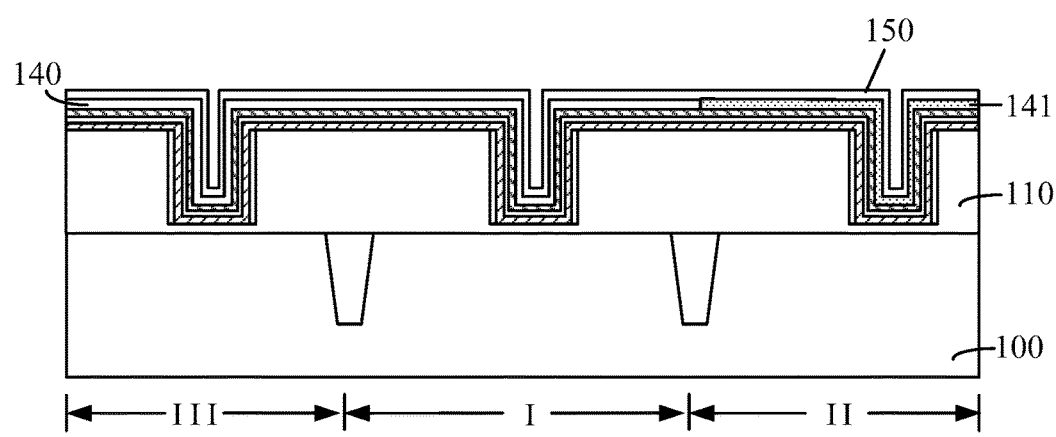

Returning to FIG. 11, after the work function layer doped with first ions is formed on the second region, the first mask is removed, and a buffer layer is formed on the semiconductor substrate to cover the work function layer (S04). FIG. 7 illustrates a cross-sectional view of a corresponding structure of the exemplary semiconductor device consistent with the disclosed embodiments.

As shown in FIG. 7, after the work function layer 141 doped with first ions is formed on the second region II, the first mask 160 may be removed, and a buffer layer 150 may be formed on the semiconductor substrate 100 to cover the work function layer 140 (including the work function layer 141 doped with first ions and the original work function layer 140 not doped with first ions).

In one embodiment, the first mask 160 may be made of deep ultraviolet light absorbing oxide (DUO). A wet etching process using a reagent such as alkyl ammonium hydroxide may be used to remove the first mask 160 and to minimize the damages to rest of the semiconductor devices.

In one embodiment, the buffer layer 150 may be made of titanium nitride ($Ti_xN_{1-x}$, $x \leq 1$), tantalum carbide (TaC), tantalum (Ta), tantalum nitride (TaN) and/or tantalum aluminum compound (TaAl).

The fabrication process of forming the buffer layer 150 may include chemical vapor deposition (CVD) and physical vapor deposition (PVD).

When the work function layer 140 is subsequently doped with the second ions to further adjust the work function of the work function layer, the buffer layer 150 may be used to obstruct the second ions from entering the work function layer and to regulate the amount of the second ions to enter the work function layer. Thus, the work function of the work function layer doped with the second ions may be adjusted.

By adjusting the thickness of the buffer layer 150, the amount of the second ions entering the work function layer may be adjusted and then the work function of the work function layer may be adjusted accordingly. When the buffer layer 150 is too thick, the amount of the second ions entering the work function layer may be too small. When the buffer layer 150 is too thin, the amount of the second ions entering the work function layer may be too large.

In one embodiment, the buffer layer 150 may have a thickness ranging approximately from 5 Å to 100 Å.

The material and the thickness of the buffer layer 150 may be adjusted to satisfy the actual need. The present disclosure does not limit the material or the thickness of the buffer layer 150.

Figure 8:
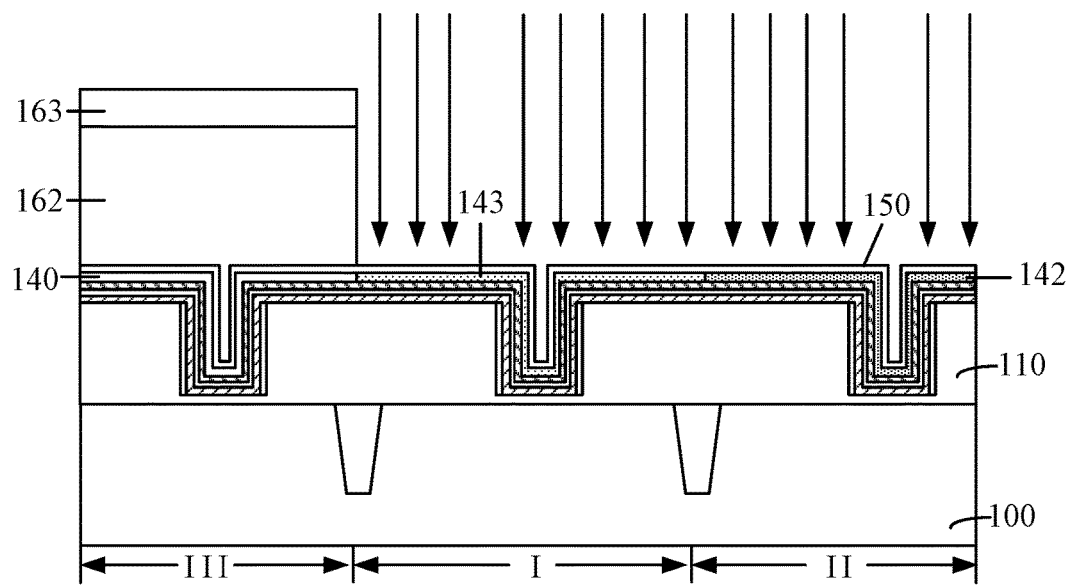

Returning to FIG. 11, a second mask is formed on the third region of the semiconductor substrate to dope second ions into the work function layer on the first region and the second region to increase the work function of the work function layer and consequently the threshold voltages of the subsequently formed first transistor and the second transistor, and to prevent the second ions from entering into the work function layer on the third region (S05). FIG. 8 illustrates a cross-sectional view of a corresponding structure of the exemplary semiconductor device consistent with the disclosed embodiments.

As shown in FIG. 8, a second mask 162 may be formed on the third region III of the semiconductor substrate 100.

In one embodiment, the second mask 162 may be made of amorphous polysilicon, amorphous carbon or DUO. To form the second mask 162, a second mask material layer may be formed on the semiconductor substrate 100. A photoresist mask 163 may be formed on the second mask material layer. The photoresist mask 163 may be used as an etch mask to etch the second mask material layer to form the second mask 162.

Optionally, the second mask 162 may have a thickness greater than or equal to the depth of the first gate electrode trench 111, the second gate electrode trench 112 and the third gate electrode trench 113 to avoid excessive etching of the second mask material layer on the third region III during the process of etching the second mask material layer in the first gate electrode trench 111 and the second gate electrode trench 112 and after the removal of the photoresist mask 163. The remaining second mask material layer may still be able to prevent second ions from entering into the work function layer on the third region III.

The fabrication process of forming the second mask 162 is the same as that of the first mask 160 and is not repeated herein.

Referring to FIG. 8, the second mask 162 may be used to dope the second ions into the work function layer 140 (including the work function layer 141 already doped with the first ions) on the first region I and the second region II to increase the work function of the work function layer and consequently the threshold voltages of the subsequently formed first transistor and the second transistor. The second mask 162 may prevent the second ions from entering into the work function layer on the third region III.

In one embodiment, the second ions may include one or more of boron (B) ions, silicon (Si) ions and fluorine (F) ions.

In one embodiment, the second ion doping process may be a plasma ion implantation process.

Optionally, the plasma ion implantation process of implanting the second ions may have a plasma implantation energy ranging approximately from 0.5 KeV to 2.0 KeV and a dosage ranging approximately from $1.0 \times 10^{14}$ atom/cm$^2$ to $1.0 \times 10^{19}$ atom/cm$^2$.

Optionally, the steps of implanting the second ions may include pumping a plasma generation gas into the reaction chamber to generate a plasma and then injecting the plasma into the buffer layer 150 and the work function layer exposed by the second mask 162.

The reaction gas may include one or more of silicon source gas, fluorine source gas and boron source gas.

Optionally, the silicon source gas may be $SiH_4$ and the boron source gas may be $BH_2$.

The plasma ion implantation process may have a controlled reaction gas flow rate ranging approximately from 30 sccm to 1000 sccm, a controlled temperature ranging approximately from 25° C. to 500° C., a power ranging approximately from 50 W to 1000 W, and an air pressure ranging approximately from 2 mtorr to 5 mtorr.

In the plasma ion implantation process for the second ions, the buffer layer 150 may obstruct portion of second ions and may let portion of second ions penetrate through the buffer layer 150 to enter the work function layer 140. Thus, the work function of the work function layer 140 may be increased.

The thickness of the buffer layer 150 may be increased to reduce the amount of the second ions entering the work function layer and consequently reduce the threshold voltages of the subsequently formed semiconductor devices. In one embodiment, for each additional 10 Å thickness of the buffer layer 150, sufficient amount of second ions may be obstructed to reduce the threshold voltages of the semiconductor devices by approximately 50 mV to 60 mV.

After the doping of the second ions is completed, the work function layer 140 already doped with the first ions may also be doped with the second ions. A work function layer 142 doped with both the first ions and the second ions may be formed to further increase the work function of the work function layer 142 on the second region II. The work function layer 140 on the first region I may be doped with the second ions to form a work function layer 143 doped with the second ions. Thus, the work function of the work function layer 143 on the first region I may be increased.

After the processes of implanting the first ions and the second ions are completed, the work function layer on the second region II may have work function greater than that of the work function layer on the first region I. the work function layer on the first region I may have a work function greater than that of the work function layer on the third region III. The semiconductor devices subsequently formed on the third region III, the first region I and the second region II may have successively increasing threshold voltages. Thus, three semiconductor devices with three different threshold voltages may be formed.

In one embodiment, the first ion doping may be the same as the second ion doping, i.e., the first ions may be the same as the second ions. The process of implanting the first ions may be the same as that of the second ions. The buffer layer 150 may be used to regulate the amount of second ions entering into the work function layer to adjust work function of the work function layer on the first region I and the second region II.

Compared to the conventional fabrication process which controls the ion implantation conditions on different regions of the semiconductor substrate 100 or controls the thickness of the work function layer on different regions of the semiconductor substrate 100 to adjust the threshold voltages of the semiconductor devices formed on different regions of the semiconductor substrate 100, the present disclosure provides a simplified and efficient fabrication process of forming semiconductor devices on different regions of the semiconductor substrate 100 with different threshold voltages.

In other embodiments, the first ion doping may be different from the second ion doping. The difference between the first ion doping and the second ion doping together with the buffer layer's obstruction of the second ion injection may jointly adjust the work function of the work function layer on different regions.

Figure 9:
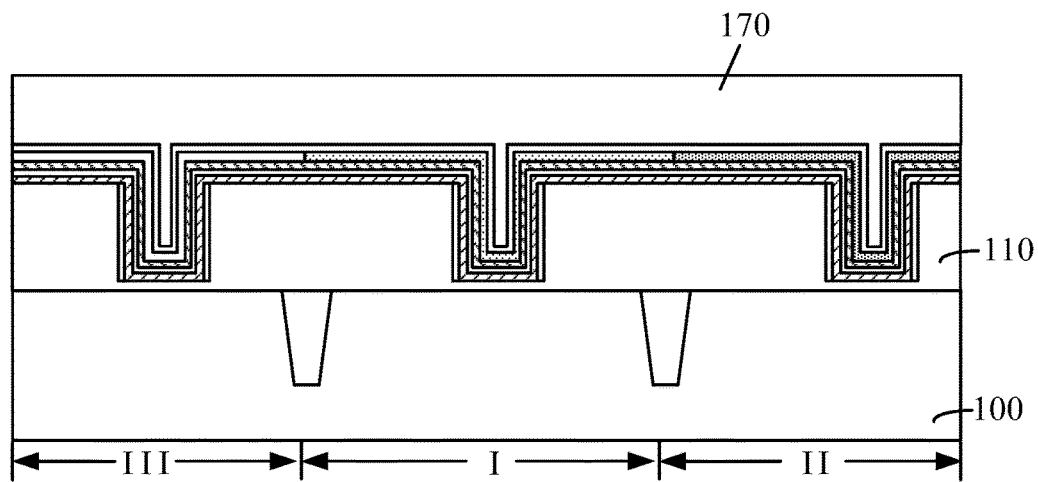

Returning to FIG. 11, after the work function of the work function layer on the first region and the second region are adjusted, a gate electrode material is formed on the semiconductor substrate to fill up the first, the second and the third gate electrode trenches (S06). FIG. 9 illustrates a cross-sectional view of a corresponding structure of the exemplary semiconductor device consistent with the disclosed embodiments.

As shown in FIG. 9, after the work function of the work function layer on the first region I and the second region II are adjusted, a gate electrode material 170 may be formed on the semiconductor substrate 100 to fill up the first, the second and the third gate electrode trenches.

The gate electrode material 170 may be made of W, Al, Co—Al, Cu or other suitable material for forming metal gate electrode. The present disclosure does not limit the gate electrode material 170.

Returning to FIG. 11, a chemical mechanical polishing process is used to remove the gate electrode material on the dielectric layer to make the surface of the gate electrode material in the first, the second and the third gate electrode trenches coplanar with the surface of the dielectric layer and to form the first, the second and the third transistors (S07).

Figure 10:
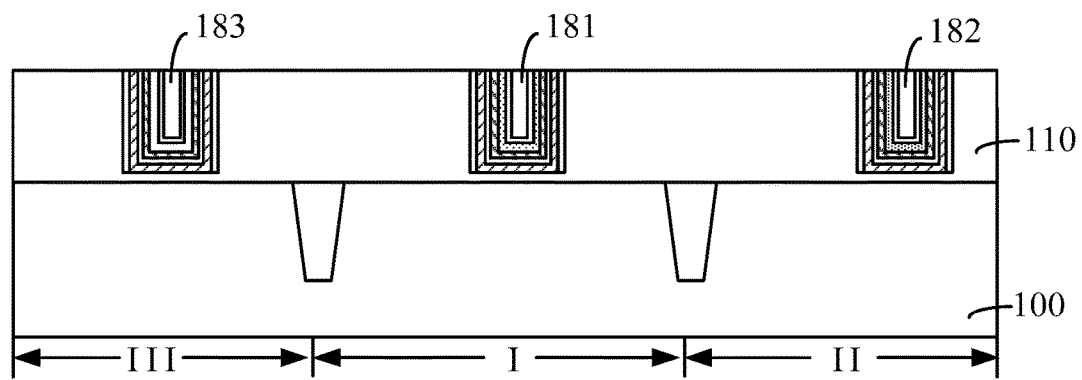
Figure 11:
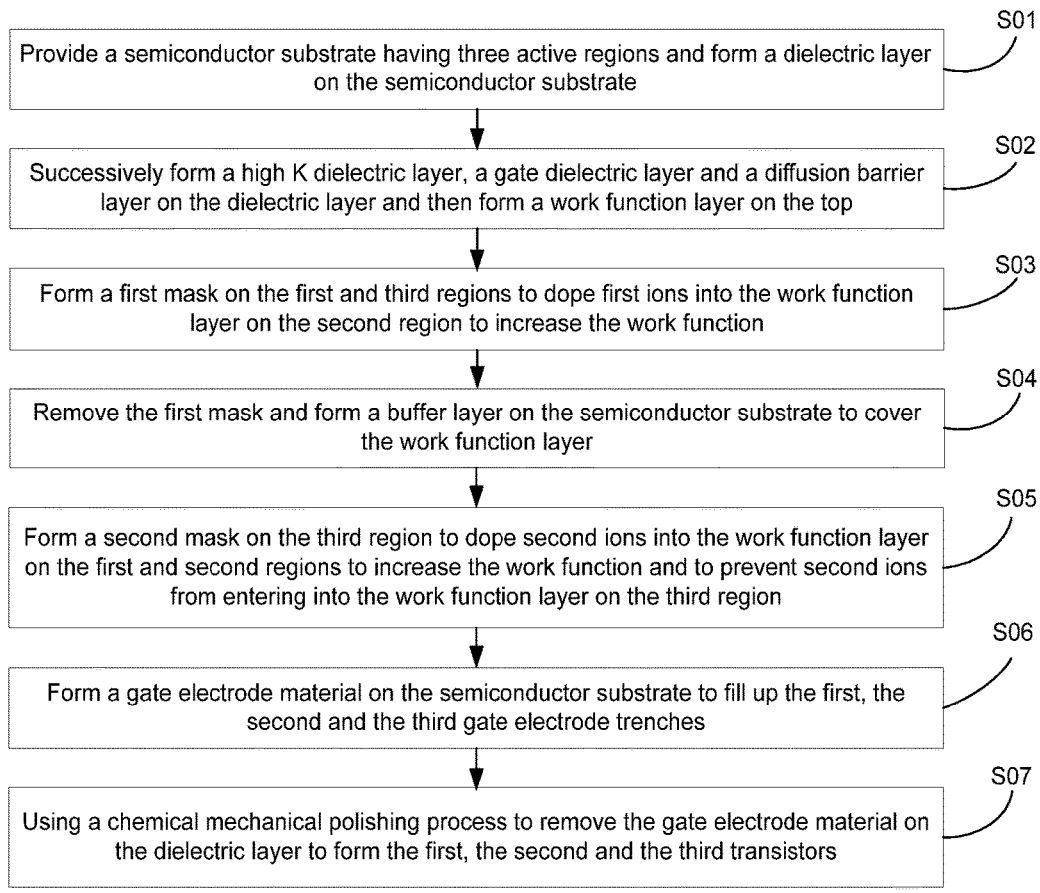
FIG. 11 illustrates a flow chart of an exemplary method for fabricating a semiconductor structure consistent with various disclosed embodiments.

FIG. 10 illustrates a cross-sectional view of a corresponding structure of the exemplary semiconductor device consistent with the disclosed embodiments.

As shown in FIG. 10, a chemical mechanical polishing process may be used to remove the gate electrode material on the dielectric layer 110 to make the surface of the gate electrode material in the first, the second and the third gate electrode trenches coplanar with the surface of the dielectric layer 110 and to form the first transistor 181, the second transistor 182 and the third transistor 183.

The first transistor 181, the second transistor 182 and the third transistor 183 may have different work function levels of the work function layers. Specifically, the work function levels of the work function layers in the second transistor 182, the first transistor 181 and the third transistor 183 may decrease successively in this order and their corresponding threshold voltages may also decrease successively in the same order. The present disclosure provides a simplified and efficient fabrication process of forming transistors with various threshold voltages.

It should be noted that the embodiments according to the present disclosure specifically include forming three transistors with three different threshold voltages. However, in other embodiments, the disclosed method may be used to form semiconductor devices with one transistor, two transistors, or more than three transistors while individually adjusting the threshold voltages of each and every transistor.

Although the present invention is disclosed above with various embodiments, the present invention is not limited thereto. Anyone skilled in the art may make various changes and modifications without departing from the spirit and scope of the present invention. Therefore the scope of the present invention should be defined by the claims thereof.

What is claimed is:

1. A semiconductor device, comprising:
   a semiconductor substrate including: a first region including a first gate electrode trench therein for forming a first transistor, a second region including a second gate electrode trench therein for forming a second transistor, and a third region including a third gate electrode trench therein for forming a third transistor, wherein the first region is between the second region and the third region;
   a work function layer covering sidewalls and bottom of each of the first, second, and third gate electrode trenches on the semiconductor substrate, wherein the work function layer has a single layer structure;
   a buffer layer on the work function layer,
   first ions and second ions in the work function layer on the second region, wherein the first ions and the second ions are different type ions; and
   second ions in the work function layer on the first region, wherein the work function on the first region has no first ions.

2. The device of claim 1, wherein:
   the work function layer covers sidewalls and bottom of the third gate electrode trench without being doped.

3. The device of claim 1, wherein:
   the buffer layer is made of a material selected from a group of titanium nitride, tantalum carbide, tantalum, tantalum nitride, and tantalum aluminum compound.

4. The device of claim 1, wherein:
   the first ions and the second ions are same type ions.

5. The device of claim 1, wherein:
   the first and the second ions are one or more of boron ions, silicon ions and fluoride ions.

6. The device of claim 1, wherein:
the first and the second ions have a dose ranging approximately from $1.0 \times 10^{14}$ to $1.0 \times 10^{19}$ atom/cm$^2$.

7. The device of claim 1, wherein:
the first transistor and the second transistor are NMOS transistors.

8. The device of claim 1, wherein:
the buffer layer has a thickness ranging approximately from 5 Å to 100 Å.

9. The device of claim 1, wherein:
the work function layer is made of a material selected from a group of tantalum carbide, titanium, aluminum, and titanium aluminum compound.

10. The device of claim 1, wherein:
the work function layer is doped through the buffer layer with impurity ions, and
the buffer layer obstructs a flow of impurity ions including the first and second ions to control a concentration of the impurity ions in different regions of the work function layer to regulate a work function of the work function layer in the first and second regions.

11. The device of claim 1, wherein:
the work function layer is configured to adjust a threshold voltage of the first transistor and a threshold voltage of the second transistor.

12. The device of claim 11, wherein:
the threshold voltage of the second transistor is higher than the threshold voltage of the first transistor.

13. The device of claim 11, wherein:
the threshold voltage of the second transistor is higher than the threshold voltage of the first transistor and the threshold voltage of the first transistor is higher than a threshold of the third transistor.

14. The device of claim 1, wherein:
the work function layer has a uniform thickness on the sidewalls and the bottom of each of the first and second gate electrode trenches on the semiconductor substrate; and
the buffer layer has a uniform thickness on the work function layer.

15. The device of claim 1, wherein:
an amount of the second ions in the work function layer is adjusted by a thickness of the buffer layer.

* * * * *